United States Patent [19]

Puri

[11] Patent Number: 5,563,593
[45] Date of Patent: Oct. 8, 1996

[54] VIDEO CODING WITH OPTIMIZED LOW COMPLEXITY VARIABLE LENGTH CODES

[75] Inventor: Atul Puri, Riverdale, N.Y.

[73] Assignee: Lucent Technologies Inc., Murray Hill, N.J.

[21] Appl. No.: 215,341

[22] Filed: Mar. 18, 1994

[51] Int. Cl.⁶ .................................................. H03M 7/40
[52] U.S. Cl. .................................................. 341/67
[58] Field of Search .................................. 341/67, 50, 63, 341/106

[56] References Cited

U.S. PATENT DOCUMENTS

| | | | |
|---|---|---|---|
| 4,534,055 | 8/1985 | Iinuma | 381/34 |
| 5,381,144 | 1/1995 | Wilson et al. | 341/63 |

*Primary Examiner*—Brian K. Young
*Attorney, Agent, or Firm*—Eugene S. Indyk; Mark K. Young

[57] ABSTRACT

A novel group of optimized variable word-length codes for intra coded pictures is disclosed. Hardware complexity and implementation cost is minimized by only optimizing the variable word-length codes for intra coded pictures for a small, but frequently occurring number of discrete cosine transform events. A table of variable word-length codes conforming to the Motion Pictures Expert Group Phase 1 ("MPEG-1") standard may be used for the remaining number of less frequently occurring events. In an illustrative example of the invention, the MPEG-1 variable word-length code table is also used to code non-intra pictures which advantageously allows for totally compatible operation with the MPEG-1 standard.

18 Claims, 7 Drawing Sheets

EOB = 2 BITS

MPEG-1 VARIABLE LENGTH CODE LENGTH SUBTABLE 301

MPEG-1 VARIABLE LENGTH CODE LENGTH REMAINDER TABLE 302

ABSOLUTE LEVEL →

RUN →

| RUN \ LEVEL | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| 0 | 3 | 5 | 6 | 8 | 9 | 11 | 13 | 13 | 13 | 13 | 13 | 14 | 14 | 14 | 14 | 16 |
| 1 | 4 | 7 | 9 | 11 | 13 | | | | | | | | | | | |
| 2 | 5 | 8 | 11 | 13 | | | | | | | | | | | | |
| 3 | 6 | 9 | | | | | | | | | | | | | | |
| 4 | 6 | 11 | | | | | | | | | | | | | | |
| 5 | 7 | 11 | | | | | | | | | | | | | | |
| 6 | 7 | | | | | | | | | | | | | | | |
| 7 | 7 | | | | | | | | | | | | | | | |
| 8 | 8 | | | | | | | | | | | | | | | |
| 9 | 8 | | | | | | | | | | | | | | | |
| 10 | 9 | | | | | | | | | | | | | | | |
| 11 | 9 | | | | | | | | | | | | | | | |
| 12 | 9 | | | | | | | | | | | | | | | |
| 13 | 9 | | | | | | | | | | | | | | | |
| 14 | 11 | | | | | | | | | | | | | | | |
| 15 | 11 | | | | | | | | | | | | | | | |
| 16 | 11 | | | | | | | | | | | | | | | |
| 17 | | | | | | | | | | | | | | | | |
| 63 | | | | | | | | | | | | | | | | |

FIG. 4

FIG. 5
VARIABLE LENGTH DECODER

FIG. 6
600

EOB = 4 BITS

ABSOLUTE LEVEL →

INTRA VARIABLE LENGTH CODE LENGTH SUBTABLE 601

MPEG-1 VARIABLE LENGTH CODE LENGTH REMAINDER TABLE 602

RUN →

|  | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| 0 | 3 | 4 | 5 | 6 | 6 | 7 | 7 | 8 | 8 | 9 | 9 | 9 | 9 | 9 | 9 | 9 |
| 1 | 4 | 6 | 8 | 9 | 9 | 9 |  |  |  |  |  |  |  |  |  |  |
| 2 | 6 | 8 | 9 | 11 |  |  |  |  |  |  |  |  |  |  |  |  |
| 3 | 6 | 9 | 11 |  |  |  |  |  |  |  |  |  |  |  |  |  |
| 4 | 7 | 9 |  |  |  |  |  |  |  |  |  |  |  |  |  |  |
| 5 | 7 | 10 |  |  |  |  |  |  |  |  |  |  |  |  |  |  |
| 6 | 8 |  |  |  |  |  |  |  |  |  |  |  |  |  |  |  |
| 7 | 8 |  |  |  |  |  |  |  |  |  |  |  |  |  |  |  |
| 8 | 8 |  |  |  |  |  |  |  |  |  |  |  |  |  |  |  |
| 9 | 8 |  |  |  |  |  |  |  |  |  |  |  |  |  |  |  |
| 10 | 8 |  |  |  |  |  |  |  |  |  |  |  |  |  |  |  |
| 11 | 9 |  |  |  |  |  |  |  |  |  |  |  |  |  |  |  |
| 12 | 9 |  |  |  |  |  |  |  |  |  |  |  |  |  |  |  |
| 13 | 9 |  |  |  |  |  |  |  |  |  |  |  |  |  |  |  |
| 14 | 10 |  |  |  |  |  |  |  |  |  |  |  |  |  |  |  |
| 15 | 10 |  |  |  |  |  |  |  |  |  |  |  |  |  |  |  |
| 16 | 11 |  |  |  |  |  |  |  |  |  |  |  |  |  |  |  |
| 17 |  |  |  |  |  |  |  |  |  |  |  |  |  |  |  |  |
| 63 |  |  |  |  |  |  |  |  |  |  |  |  |  |  |  |  |

FIG. 9

VIDEO CODING WITH OPTIMIZED LOW COMPLEXITY VARIABLE LENGTH CODES

TECHNICAL FIELD

This invention relates to coding of video signals. More particularly, this invention relates to improved variable length coding to improve overall coding efficiency.

BACKGROUND

Transform coding is an efficient image compression scheme that typically involves segmenting a picture, or image, into blocks of pixels, taking discrete cosine transforms ("DCTs") of the blocks of pixels to obtain blocks of DCT coefficients, quantizing these coefficients, and coding the quantized coefficients by an entropy coder. Interframe coding schemes utilizing motion compensation and transform coding of motion compensated interframe differences, by taking DCTs of blocks of difference pixels, quantizing the DCT coefficients and entropy coding the quantized DCT coefficients, may also be employed.

Interframe coding employing motion compensation and DCT coding has become widely recognized as a particularly efficient coding scheme for video compression and forms the core of the Comité Consultatif International Télégraphique et Téléphonique Recommendation H.261-Video Codec for Audiovisual Services at 64 Kbit/s, Geneva, August, 1990 ("CCITT H.261") and the Motion Pictures Expert Group Phase 1 ("MPEG-1") video compression standards. The MPEG-1 standard is set forth in International Standards Organization ("ISO") Committee Draft 11172-2, "Coding of Moving Pictures and Associated Audio for Digital Storage Media at up to 1.5 Mbits/s," November, 1991. The CCITT H.261 standard primarily addresses coding of video conferencing scenes of Common Intermediate Format resolution at bitrates of 64 kbit/s to 2 Mbit/s; the MPEG-1 standard can be efficiently used for coding all types of video scenes in the 1 to 2 Mbit/s range. The MPEG-1 standard incorporates additional features, for example, group-of-pictures concepts, motion compensated bidirectional prediction, and variable word-length coding. Variable word-length coding, which is also known as Huffman coding, is typically employed after the DCT portion of the encoding process. Each DCT event, comprised of run-length and level, is represented by a codeword whose length depends upon the relative value of the coefficient. Longer word lengths may be used to represent higher valued coefficients while shorter word lengths may be used to represent coefficients having a value of zero or close to zero. MPEG-1 supports the coding intra-coded ("I-"), predictive-coded ("P-"), and bidirectional predictive ("B-") pictures. Unfortunately, because the MPEG-1 standard was initially applied in the coding of low resolution video, it is not fully optimized for coding of higher resolution video sources such as interlaced video conforming to the Comité Consultatif International des Radiocommunications Recommendation 601 and the high definition television format.

Consequently, many improvements to video coding have been developed since the adoption of the MPEG-1 standard. One such improvement is discussed in U.S. Pat. No. 5,227,878 by A. Puri et al. which includes reference to adaptive word-length coding. The use of such a variable word-length coding scheme produces a substantial improvement in coding efficiency.

SUMMARY

The efficiency of variable word-length coding is significantly increased, in accordance with the invention, by employing a novel group of optimized variable word-length codes for intra coded pictures. Hardware complexity and cost is minimized by only optimizing the variable word-length codes for intra coded pictures for a small, but frequently occurring, number of DCT events. An MPEG-1 variable word-length coding table may be used for the remaining larger number of less frequently occurring events.

In an illustrative example of the invention, the MPEG-1 variable word-length code table is also used to code non-intra pictures which advantageously allows for totally compatible operation with the MPEG-1 standard.

The discussion in this Summary and the following Brief Description of the Drawings, Detailed Description, and drawings only deal with examples of this invention and is not to be considered in any way a limitation on the scope of the exclusionary rights conferred by a patent which may issue from this application. The scope of such exclusionary rights is set forth in the claims at the end of this application.

DETAILED DESCRIPTION

Figure 1:
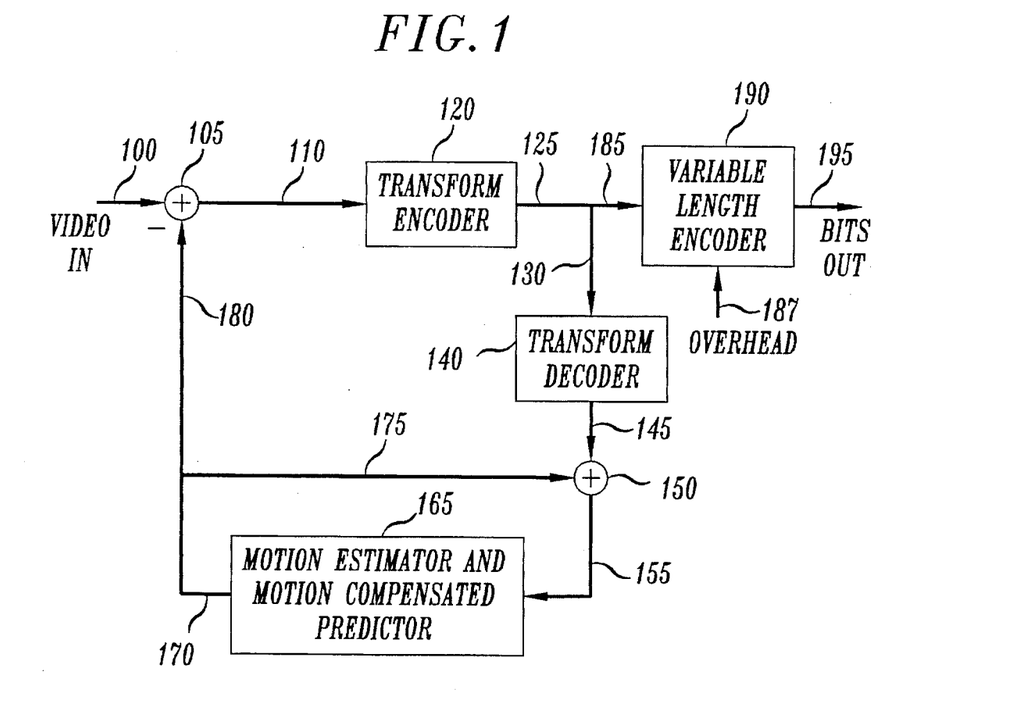
FIG. 1 is a simplified block diagram of an illustrative interframe motion compensated transform encoder.

FIG. 1 is a simplified block diagram of an illustrative interframe motion compensated transform encoder. Video frames enter one-by-one at bus 100. Subtracter 105 differences an input frame of video on bus 100 with a prediction frame available on bus 180. The resulting prediction error signal appears on bus 110 and is transform encoded by the transform encoder 120 which outputs quantized and scanned transform coefficients on bus 125, and also simultaneously on buses 130 and 185. Variable length encoder 190 entropy encodes these coefficients and the overhead on bus 187 and outputs a multiplexed stream of bits on bus 195 for transport over a transmission channel or to a storage disk for delivery to a decoder. The coefficients also are fed back on bus 130 to transform decoder 140 which outputs on bus 145, an approximation of the prediction error signal sent on bus 110. To this approximated prediction error signal on bus 145, the prediction signal available on bus 175 is summed in the adder 150, resulting in locally reconstructed output on bus 155 which is fed to motion estimator and motion compensated predictor 165 whose output is the prediction signal on bus 170. As will be appreciated by those skilled in the art, the operation of motion estimator and motion compensated predictor 165 need not be disclosed in great detail here in order to practice the invention. However, it is necessary to explicitly state that motion compensated estimator and predictor 165 not only computes motion estimates required for forward prediction, as in the CCITT H.261 standard, but also computes motion estimates required for forward and backward predictions as in the MPEG-1 standard. The prediction signal on bus 170 is simultaneously made available on bus 180 as an input to subtracter 105, as well as on bus 175 as an input to adder 150.

Figure 2:
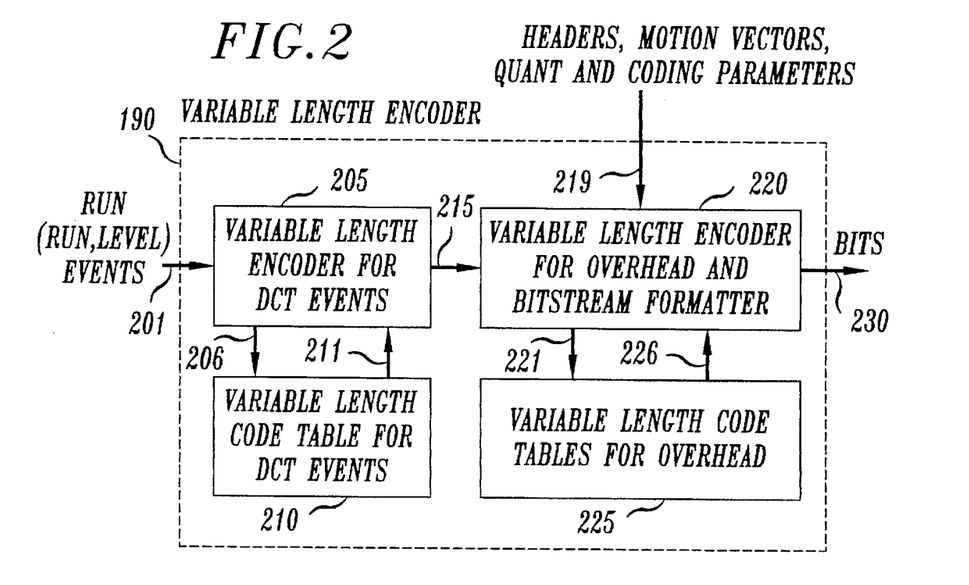
FIG. 2 is a block diagram of details of an illustrative variable length encoder which is part of the interframe motion compensated transform encoder shown in FIG. 1.

FIG. 2 is a block diagram of details of an illustrative variable word-length encoder 190 which is part of the interframe motion compensated transform encoder shown in FIG. 1. It is necessary to point out that the following description of the concept of variable word-length encoding is substantially simplified for the purpose of illustrating the invention. Of course, those skilled in the art will appreciate that an actual implementation of the invention could be facilitated by performing equivalent operations without explicitly following the structure shown here. The DCT events, comprising run-length and level, from transform encoder 120 (FIG. 1) are fed on bus 201 to variable word-length encoder for DCT events 205, which in turn, sends events one-by-one on line 206 to variable word-length code table for DCT events 210. The coded representation of these events is output on line 211 to variable word-length encoder for DCT events 205. Variable word-length encoder for DCT events 205 concatenates the coded representation with some fixed length codes, if necessary, before outputting the coded bits representing DCT events on bus 215 to variable word-length encoder of overhead and bitstream formatter 220, which has at its other input 219, various overhead data such as headers, motion vectors, quantization and coding parameters. This overhead data is sent to variable word-length code tables for overhead 225 on line 221 and coded representation of the overhead is returned on line 226. The codes representing overhead are multiplexed with coded DCT events in variable word-length encoder of overhead and bitstream formatter 220 to form a bitstream which is output on bus 230.

Figure 3:
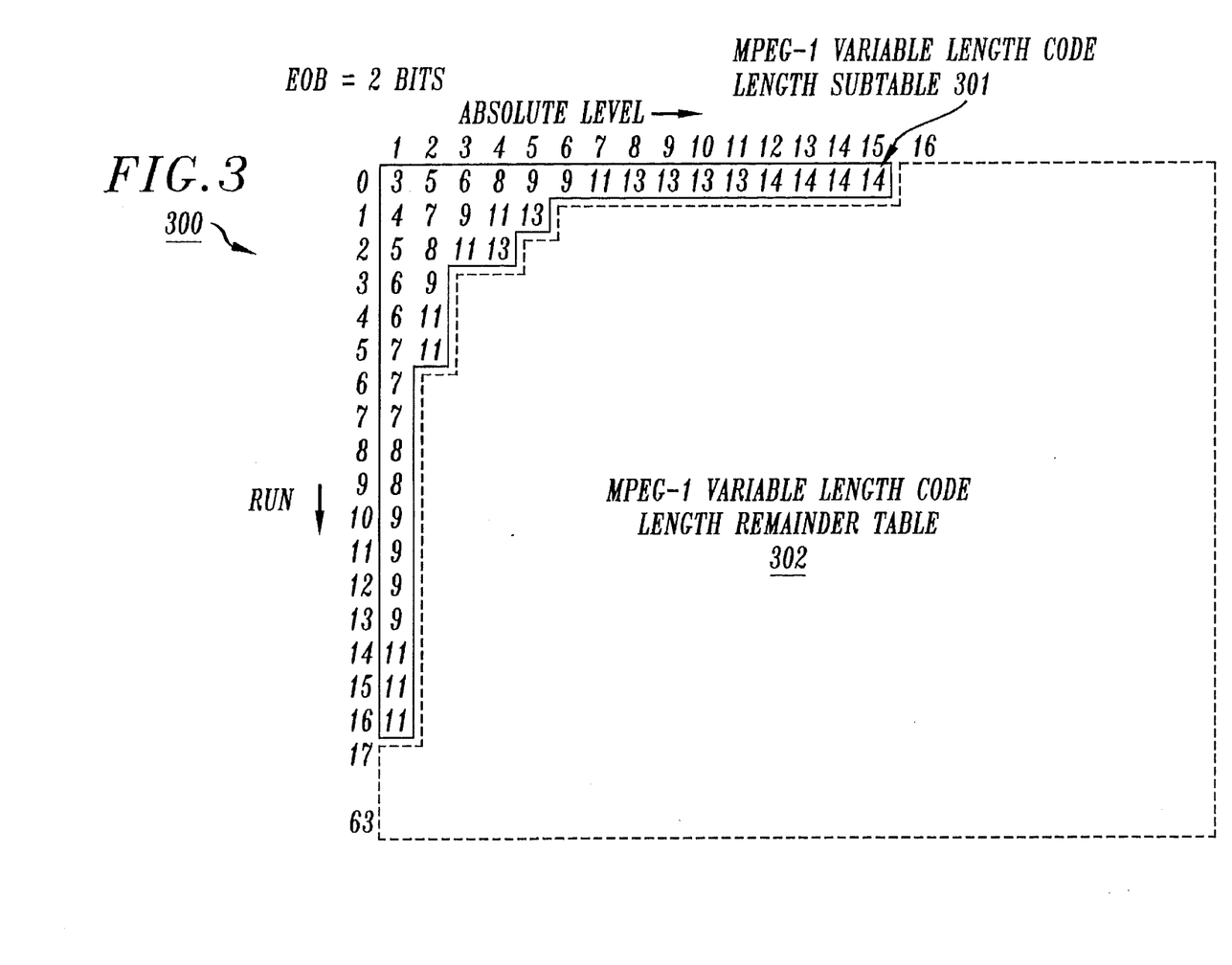
FIG. 3 shows the code length assignments of a variable length code table for DCT events conforming to the MPEG-1 standard employed by the illustrative variable length encoder shown in FIG. 2 and the illustrative decoder shown in FIG. 5.
Figure 5:
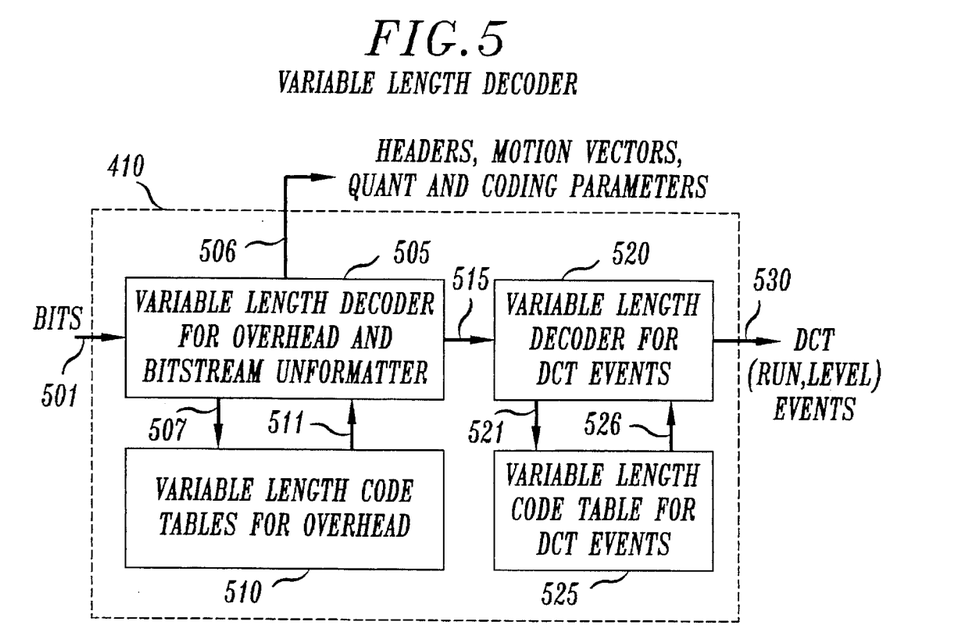
FIG. 5 shows details of the illustrative variable length decoder which is part of interframe motion compensated transform decoder shown in FIG. 4.

FIG. 3 illustrates the code length assignments of a variable word-length code table for DCT events conforming to the MPEG-1 standard employed by the illustrative encoder shown in FIG. 2 and the illustrative decoder shown in FIG. 5. Included in FIG. 3 are variable word-lengths code table 300, subtable 301, and remainder table 302. Shorter code lengths are assigned to the very frequently occurring events in the subtable 301, where as longer codewords are assigned to events occurring in the remainder table 302. As will be appreciated by those skilled in the art, none of these tables show the actual variable word-length codes, but rather, only the lengths of these codes. This variable word-length code table is included in the MPEG-1 standard. However, the MPEG-1 variable word-length code table is relevant to the invention in that I have superimposed a subtable and remainder table approach to the table which forms the basis for low complexity, but optimized, variable word-length code tables as described in greater detail below.

Figure 4:
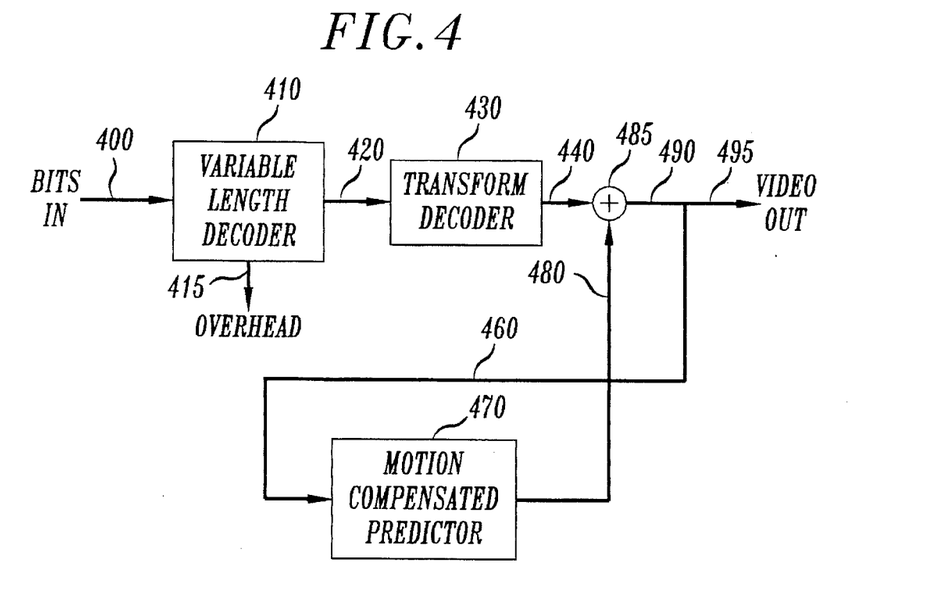
FIG. 4 is a simplified block diagram of an illustrative interframe motion compensated transform decoder which corresponds to illustrative encoder shown in FIG. 1.

FIG. 4 is a simplified block diagram of an illustrative interframe motion compensated transform decoder which corresponds to the illustrative encoder shown in FIG. 1. An incoming stream of bits from a transport medium, such as a transmission channel or a storage disk, is input over bus 400 to variable word-length decoder 410. Variable word-length decoder 410 demultiplexes and decodes the bit pattern codes representing different overheads 415, and the encoded events representing quantized DCT events. The latter are output on bus 420 and fed to transform decoder 430. Transform decoder 430 is an exact replica of transform decoder 140 in the local decoding loop of the generalized interframe encoder shown in FIG. 1. In fact, in absence of errors on the transport medium, the input on bus 420 of the transform decoder 430 and the output of transform decoder on bus 440, carry the exact corresponding signals as the input on bus 130 of the transform decoder 140 and its output on bus 145. Next, the decoded blocks of pixels representing approximated prediction error signal on bus 440 are summed in adder 485 with prediction signal 480 at the output of motion compensated predictor 470. The output of the adder 485 appears on bus 490 and represents the decoded video at bus 495. The same output is also fed back to the motion compensated predictor 470 via bus 460 and the prediction generated by 470 is output on bus 480 forming one input to adder 485. Those skilled in the art will appreciate that the principles of operation of motion compensated predictors is known in the art and need not be presented in detail here. As above, motion compensated predictor 470 can produce not only the forward prediction, as in the CCITT H.261 standard, but also the forward and the backward predictions as in the MPEG-1 standard. Thus, the operation of motion compensation loop of the local encoder and decoder are practically identical, except that the decoder does not compute motion vectors, as they are extracted from the decoded bitstream.

FIG. 5 illustrates details of the illustrative variable word-length decoder which is part of interframe motion compensated transform decoder shown in FIG. 4. An incoming bitters on bus 501 is input to variable word-length decoder for overhead and bitstream unformatter 505 which, depending on the context, tries to match the codes in the bitstream sent over line 507 with the codes in variable word-length code tables for overhead 510. Decoded overhead data is output on line 511. The decoded overhead stream is identified as individual overhead data such as headers, motion vectors, quantization and coding parameters. This data is output on line 506 while the remaining undecoded bitstream comprising DCT events is sent on bus 515 to variable word-length decoder for DCT events 520 which tries to match the bitstream on line 521 to the variable word-length code table for DCT events 525. The matched events are sent on line 526 to variable word-length decoder for DCT events 520 which outputs them on bus 530. This process continues until the sequence end code in the bitstream is reached.

Figure 6:
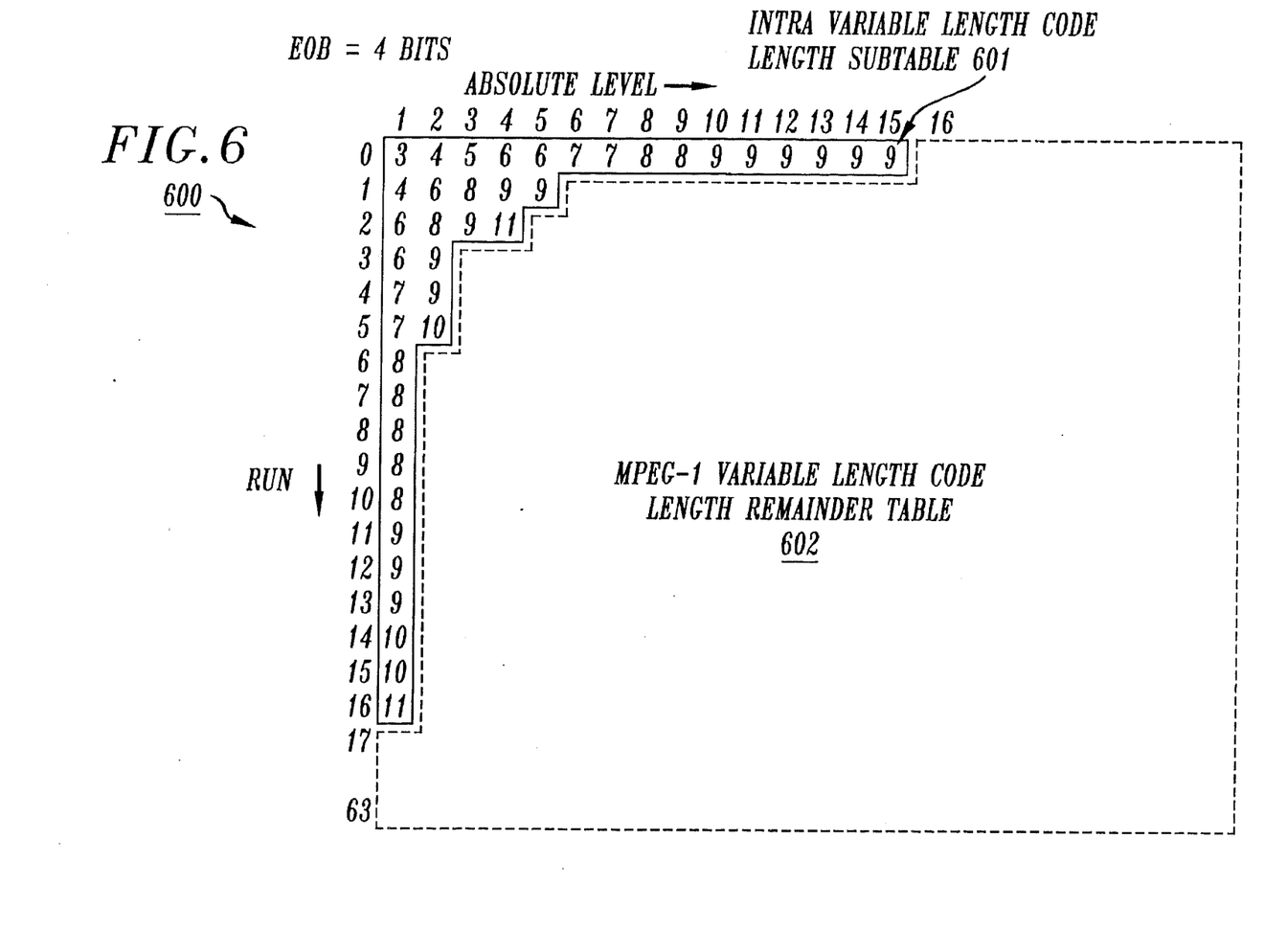
FIG. 6 shows the optimized code lengths in the variable length code table for intra DCT events employed by the illustrative encoder shown in FIG. 2 and the illustrative decoder shown in FIG. 5, in accordance with the invention.

FIG. 6 shows the optimized code length assignments to the various DCT events in the intra variable word-lengths code table 600, in accordance with the invention. Also shown is subtable 601 which has the same shape as subtable 301 shown in FIG. 3. Shorter code lengths are assigned to the very frequently occurring events in subtable 601, whereas longer codewords are assigned to the less frequently occurring events in remainder table 602. The specific code lengths in subtable 601 are different from that in subtable 301, in accordance with the invention, since the code length assignments in subtable 601 are based on optimizations on DCT events produced by the intra signal, whereas codes in 301 were based on optimization on DCT events produced by nonintra (i.e., inter and/or predicted) signals. As above when discussing FIG. 3, table 600 does not show the actual variable word-length codes, but only the lengths of these codes. The actual variable word-length codes for intra DCT events subtable are listed in Table 1 below. The remainder table codes are same as that in MPEG-1 and are not shown here. Thus, to keep the complexity low, only a new subtable is introduced which contains optimized codes for frequently occurring events while retaining the MPEG-1 codes for remaining intra DCT events. This variable word-length code length subtable and remainder table approach used by my invention significantly reduces implementation complexity without compromising performance. Advantageously, higher compression than that afforded by the MPEG-1 based variable word-length coding for intra signals is thus achieved.

Figure 7:
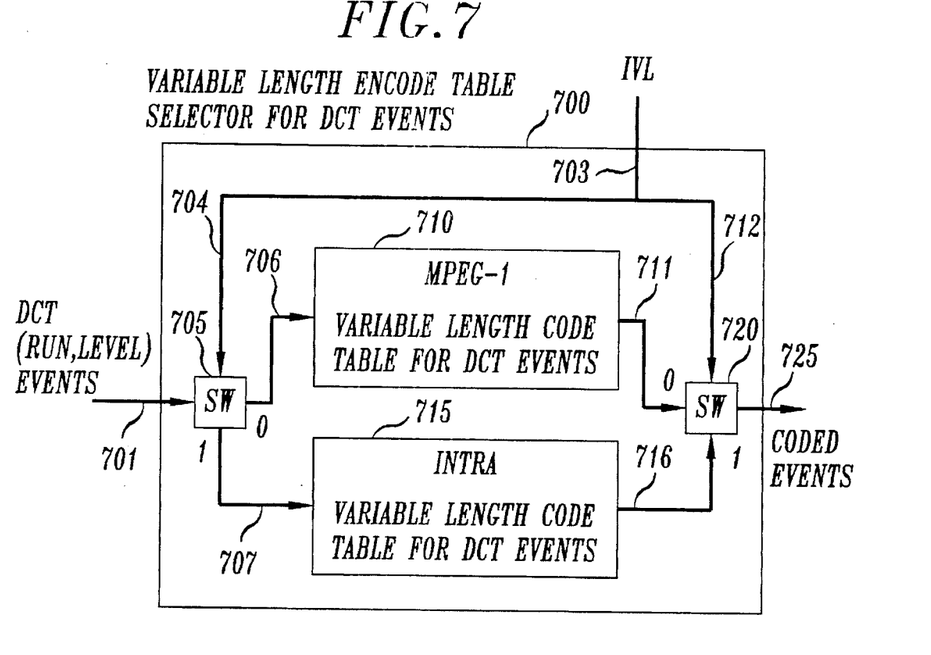
FIG. 7 is a simplified block diagram of an illustrative variable length encoder table selector for DCT events, arranged in accordance with the invention.

FIG. 7 is a simplified block diagram of a variable word-length encoder table selector for DCT events, arranged in accordance with the invention. Variable word-length encode table selector for DCT events 700 allows selection between the MPEG-1 variable word-length code table for DCT events shown in FIG. 3 and the variable word-length code table for intra DCT events shown in FIG. 6. Quantized DCT events appear on bus 701 and pass through a switch 705 which is controlled by signal "ivl" on bus 704 after the events are scanned into a one-dimensional sequence (not shown). The output of switch 705 appears on bus 706 if the "ivl" signal is disabled and on to the MPEG-1 variable word-length code table for DCT events 710. MPEG-1 variable word-length code table for DCT events 710 outputs a coded representation of the DCT events on bus 711 and through switch 720, which is controlled by the "ivl" signal on bus 712, to bus 725. If the "ivl" signal is enabled, DCT events are fed to bus 707 through switch 705, coded using intra variable word-length code table for DCT events 715, and output on bus 716 through switch 720 to bus 725 as shown. The "ivl" signal is enabled if intra variable word-length table for DCT events 715 is to be used and applied to code intra macroblocks only. The nonintra macroblocks are coded with the MPEG-1 variable word-length code table.

Figure 8:
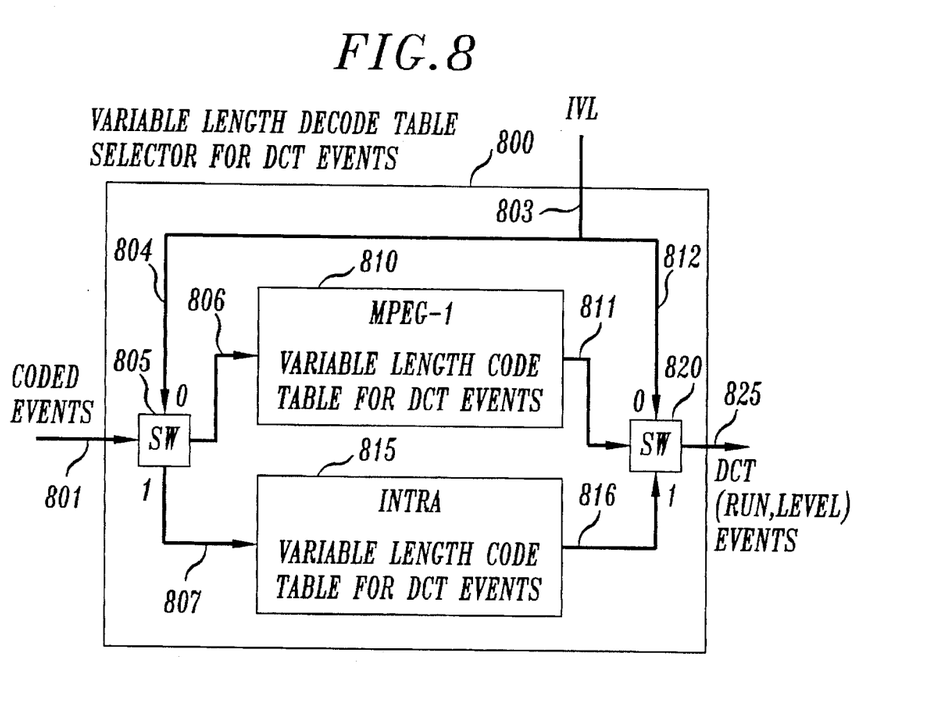
FIG. 8 is a simplified block diagram of an illustrative variable length decoder table selector for DCT events, arranged in accordance with the invention.

FIG. 8 is a simplified block diagram of an illustrative variable word-length decoder table selector for DCT events, arranged in accordance with the invention. Variable wordlength decode table selector for DCT events 800 allows selection between the MPEG-1 variable word-length code table for DCT events shown in FIG. 3 and the variable word-length code table for intra DCT events shown in FIG. 6. Variable word-length coded DCT events appear on bus 801 and pass through switch 805 which is controlled by signal "ivl" on bus 805. The output of switch 805 appears on bus 806 if "ivl" is disabled and to the MPEG-1 variable word-length code table 810, which outputs decoded DCT events on bus 811 and then through switch 820, which is controlled by "ivl" on bus 812, to bus 825. If "ivl" is enabled, variable word-length coded DCT events are fed to bus 807 through switch 805 and decoded using intra variable word-length code table 815 and output on bus 816 through switch 820 to bus 825. The "ivl" signal is enabled if intra variable word-length table 815 is to be used and applied for decoding of intra macroblocks only. The nonintra macroblocks are decoded with the MPEG-1 variable word-length code table.

Those skilled in the art will appreciate that the adaptive selection between two variable word-length code tables can be applied on a block, a macroblock or on a picture basis. However, as a practical constraint, the overhead necessary to indicate variable word-length code table selection information to the decoder becomes significant compared to the savings if selection on a macroblock or block basis is adopted. Furthermore, the encoder complexity also increases substantially when posterior selection of the variable word-length code table, based on bit counting using both tables and selecting the one producing smaller bit counts, is adopted. In addition, for the most optimum results, a full variable word-length code table is necessary in addition to the MPEG-1 variable length code table for DCT events. I have determined that a good tradeoff in complexity versus improvement in performance is achieved by providing an extra variable word-length code table in addition to the MPEG-1 table, but keeping it small in size using a subtable/remainder table approach in accordance with the invention. Additionally, the table is selectable on a global basis, such as at a sequence layer or picture layer, to apply to all intra coded macroblocks. Local adaptation between the two tables on a block or macroblock layer is not allowed.

Figure 9:
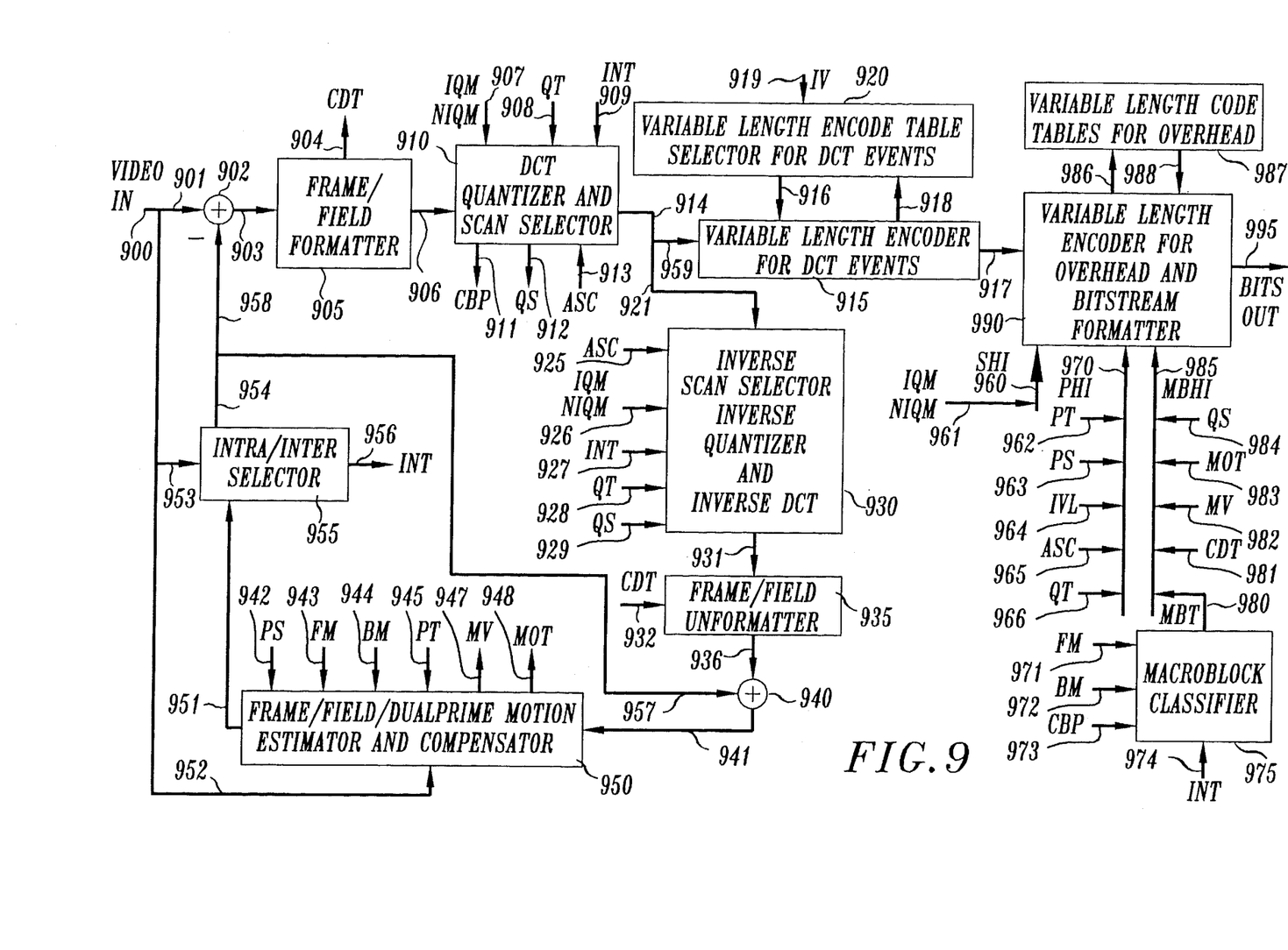
FIG. 9 is a simplified block diagram of an illustrative encoder employing selectable variable length coding from an MPEG-1 variable length code table and the variable length table for intra DCT events shown in FIG. 6, in accordance with the invention.
Figure 10:
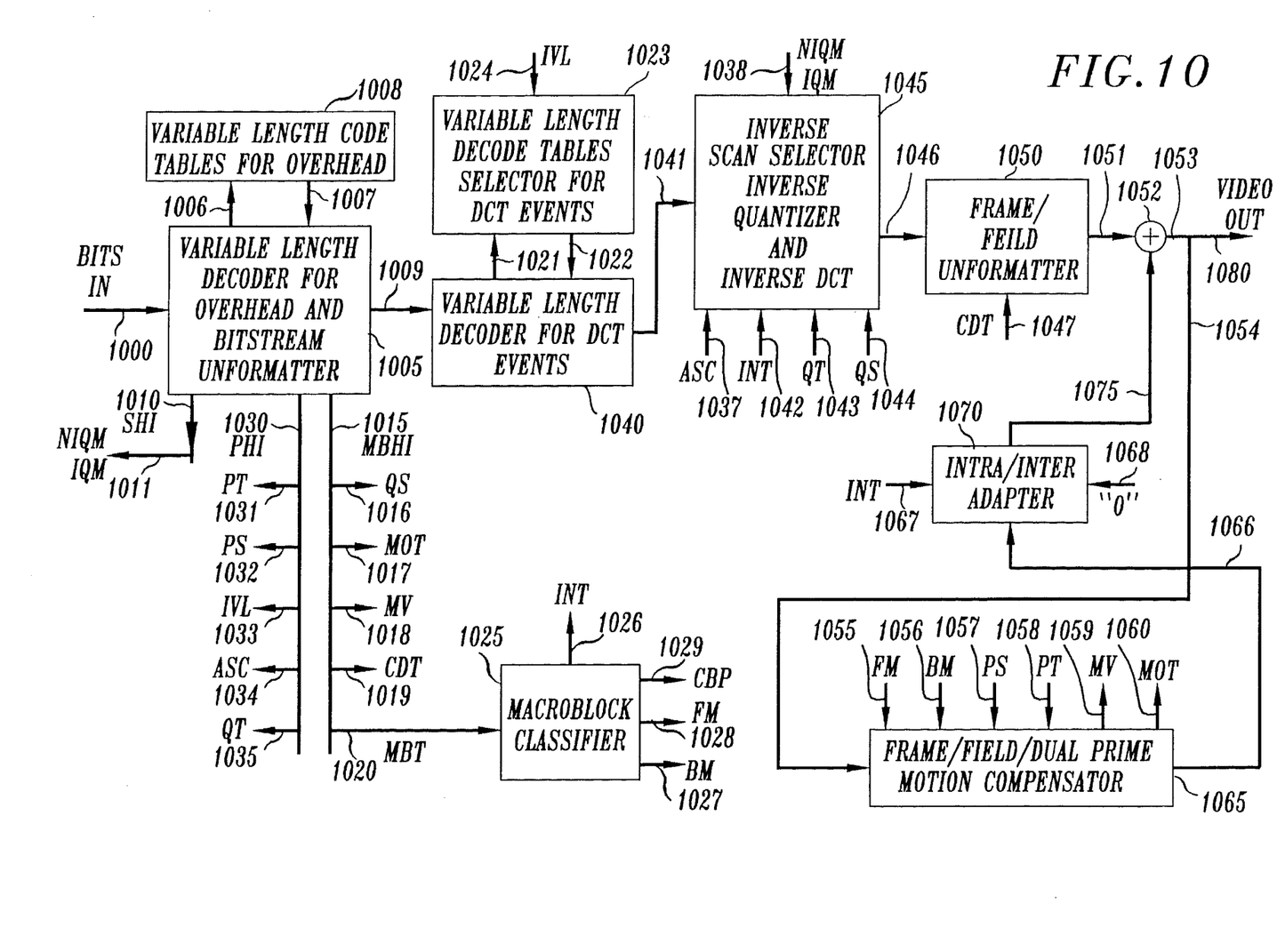
FIG. 10 is a simplified block diagram of an illustrative decoder employing selectable variable length code from an MPEG-1 variable length code table and the variable length table for intra DCT events shown in FIG. 6, in accordance with the invention.

Various control and data signals helpful in understanding the operation of some of elements in FIGS. 9 and 10 are listed below:

pt: picture types allowed are I-, P-, B- as in MPEG- 1.

ps: picture structure (Frame or field).

ivl: vlc selection for a picture.

qt: quantizer type table selected for a picture.

asc: alternate scan selected for a picture mv: motion vector/s of a macroblock.

mot: motion type (Frame or field or dualprime or sub-macroblock) for a macroblock.

cdt: coding type (Frame or field) for a macroblock.

fm: forward motion direction of a macroblock.

bm: backward motion direction of a macroblock.

qs: quantizer scale chosen for a macroblock.

cbp: coded block pattern of a macroblock int: intra/inter coding mode for a macroblock.

shi: sequence header information phi: picture header information mbhi: macroblock header information.

iqm: intra quantizer matrix for a sequence or part of a sequence.

niqm: nonintra quantizer matrix for a sequence or pan of a sequence.

FIG. 9 is a simplified block diagram of an illustrative encoder employing selectable variable word-length code from an MPEG-1 variable word-length code table and the variable word-length table for intra DCT events shown in FIG. 6, in accordance with the invention. The structure of this encoder is quite similar to the generalized interframe encoder shown in FIG. 1. Although it shows several extra operations and low level data and control signals, the portions of the circuit not directly related to our invention is not covered in great detail as it will be readily apparent to those skilled in the art.

Video enters at bus 900 and is input via bus 901 to subtracter 902 where it is differenced with its prediction signal on bus 958. The difference appears on bus 903 and enters frame/field formatter 905 where it is retained as frame blocks or converted to field blocks on a macroblock basis. The output of frame/field formatter 905 appears on bus 906 and undergoes various DCT transform, quantization and scanning of quantized DCT coefficients operations in DCT, quantizer, and scan selector 910. For quantization, on a picture basis, a selection from two quantization tables is allowed by the "qt" signal. The intra or inter quantization characteristics are selected by the "int" signal on a macroblock basis and corresponding quantization weighting matrix "iqm" and "niqm" are applied. The outcome of operations in DCT, quantizer, and scan selector 910 include quantized DCT coefficients scanned to generate DCT events on bus 914. Signals representing coded blocks in a macroblock "cbp" on line 911, quantizer step size "qs" on line 912, and scan selection information "asc" on line 913 are also utilized as shown. The scanned quantized coefficients appear on bus 914 and are sent to variable word-length encoder for DCT events 915 which uses a variable word-length table selector 920 under the control of intra variable word-length selection information "ivl" on line 919. Variable word-length encoder for DCT events 915 is similar in form and operation as selector 700 shown in FIG. 7. Generated codes from variable word-length encoder for DCT events 915 are sent on bus 917 to variable word-length encoder for overhead and bitstream formatter 990 where various type of overhead headers, such as sequence layer headers "shi" on bus 960, picture layer headers "phi" on bus 970, macroblock header information "mbhi", which consists of motion vectors, quantization and coding information on bus 985, are coded using variable word-length code table for overhead 987. The resulting multiplexed bitstream is output on bus 995 and may be packetized (not shown) before storage on a disk or transmission. The sequence header information on bus 960 consists of intra and inter quantization weighting matrices on line 961. The picture header information on bus 970 carries picture type "pt" on line 962, picture structure "ps" on line 963, intra VLC selection "ivl" on line 964, alternate scan selection "asc" on line 965 and quantizer type "qt" on line 966. The macroblock header information on bus 985 carries quantizer step "qs" on line 984, motion type "mot" on line 983, motion vector "mv" on line 982, coding type "cdt" on line 981, and macroblock type "mbt" on line 980. The macroblock type is obtained from macroblock classifier 975 as a result of input control signals including forward motion "fm" on line 971, backward motion "bm" on line 972, coded block pattern "cbp" on line 973 and intra/inter decision "int" on line 974. The bitstream representing coded data and overhead appears on bus 995 for transport or storage.

A local decoding loop at the encoder receives scanned quantized DCT coefficients on bus 921. These DCT coefficients are inverse scanned in inverse scan selector, inverse quantizer, and inverse DCT 930 which requires alternate scan control "asc" to determine which scan to use, as several alternate scans may be available. The DCT coefficients are then inverse quantized and inverse DCT in inverse scan selector, inverse quantizer, and inverse DCT 930. All but one of the control signals input or output from DCT, quantizer, and scan selector 910 are input control signals to inverse scan selector, inverse quantizer and inverse DCT 930. Line 926 carries quantizer matrices, line 927 carries "int", line 928 carries "qt", and line 929 carries "qs". The output of inverse scan selector, inverse quantizer, and inverse DCT 930 includes reconstructed prediction error blocks on bus 931 which undergo frame/field unformatting in field/frame unformatter 935 to invert the formatting operation of 905. The reorganized prediction error blocks on bus 936 are summed with the motion compensated prediction on bus 957 in adder 940 resulting in local reconstructed output on bus 941, which in turn is used for calculation of motion compensated prediction in frame/field/dualprime motion estimator and compensator 950. There are several choices regarding motion compensation methods in frame/field/dualprime motion estimator and compensator 950. The best choice is indicated by motion type "mot" on line 948 and the corresponding motion vectors "mv" are output on 947. Several control signals such as picture structure "ps" on line 942, forward motion "fm" on line 943, backward motion "bm" on line 944 and picture type "pt" on line 945, control the operation of frame/field/dualprime motion estimator and compensator 950, whose output is a motion compensated prediction signal on bus 951. This signal is compared with original on bus 953 to determine which signal would be more efficient to code in intra/inter selector 955, yielding a control signal "int" on line 956 and prediction signal on bus 954 which appears simultaneously on buses 957 and 958.

FIG. 10 is a simplified block diagram of an illustrative decoder employing selectable variable word-length codes from an MPEG-1 variable word-length code table and the variable word-length table for intra DCT events shown in FIG. 6, in accordance with the invention. The decoder performs a subset of operations performed by local decoder in the encoder shown in FIG. 9, Thus it only needs to be described briefly. A bitstream at bus 1000 feeds a variable word-length decoder for overhead and bitstream unformatter 1005, where depending on the context, codewords representing control and data forming sequence header information and macroblock header information, are identified and their values decoded using variable word-length code tables for overhead 1008. The sequence header information "shi" is available on bus 1010 and comprises quantizer matrices "iqm" and "niqm" on line 1011. The picture header information "phi" is available on bus 1030 and comprises picture type "pt" on line 1031, picture structure "ps" on line 1032, intra vlc select "ivl" on line 1033, alternate scan select "asc" on line 1034, and quantizer type "qt", on line 1035. The macroblock header information on bus 1015 comprises quantizer step size "qs" on line 1016, motion type "mot" on line 1017, motion vectors "mv" on line 1018, coding type "cdt" on line 1019, and macroblock type "mbt" on line 1020. The macroblock type "mbt" on line 1020 is analyzed in macroblock unclassifier 1025 to yield intra/inter decision "int" on line 1026, coded block pattern "cbp" on bus 1029, forward motion "fro" on line 1028, and backward motion "bm" signal on line 1027. The remaining bitstream containing DCT events are decoded in variable word-length decoder for DCT events 1040 using variable word-length decode tables selector for DCT events 1023 under control of intra variable word-length selection signal "ivl" on line 1024. Decoded coefficient data is output on bus 1041 and forms the input to inverse scan selector, inverse quantizer and inverse DCT 1045.

In inverse scan selector, inverse quantizer and inverse DCT 1045, an inverse scan operation reorders the DCT coefficients to produce normally ordered DCT coefficients. Inverse scan selector, inverse quantizer and inverse DCT 1045 uses quantization matrices "iqm" and "niqm" on line 1038, intra/inter decision "int" on bus 1042, quantizer type "qt" on bus 1043, and quantizer step size "qs" on bus 1044 to perform inverse quantization. The output of inverse scan selector, inverse quantizer and inverse DCT 1045 on bus 1046 is frame/field unformatted in frame/field unformatter 1050 into blocks of pixels on bus 1051. The blocks are summed to a motion compensated prediction signal on bus 1075 in adder 1052. The resulting signal on bus 1053 includes reconstructed video on bus 1053, 1054 and 1080. The reconstructed video on bus 1054 is used to generate motion compensated prediction in frame/field/dualprime motion compensator 1065 which is controlled by signals "fm" on line 1055, "bm" on line 1056, "ps" on line 1057, "pt" on line o 1058, "my" on line 1059, and "mot" on line 1060. The major difference with respect to frame/field/dualprime motion estimator and compensator 950 in encoder (FIG. 9) is that these signals do not need to be generated, but are instead extracted from various header information layers in the bitstream. The output of frame/field/dualprime motion estimator and compensator 1056 is available on bus 1066, and is either applied unaltered to bus 1075 via intra/inter adapter 1070 or is zeroed out when "int" on line 1067 controlling intra/inter adapter is "1" and output on bus 1075.

TABLE 1

| Variable word-length Code | Run-length | Level |
|---|---|---|
| 0110 | EOB | |
| 10s | 0 | 1 |
| 010s | 1 | 1 |
| 110s | 0 | 2 |
| 00101S | 2 | 1 |
| 0111s | 0 | 3 |
| 00111s | 3 | 1 |
| 000110s | 4 | 1 |
| 00110s | 1 | 2 |
| 000111s | 5 | 1 |
| 0000110s | 6 | 1 |
| 0000100s | 7 | 1 |
| 11100s | 0 | 4 |
| 0000111s | 2 | 2 |
| 0000101s | 8 | 1 |
| 1111000s | 9 | 1 |
| 11101s | 0 | 5 |
| 000101s | 0 | 6 |
| 1111001s | 1 | 3 |
| 00100110s | 3 | 2 |
| 1111010s | 10 | 1 |
| 00100001s | 11 | 1 |
| 00100101s | 12 | 1 |
| 00100100s | 13 | 1 |
| 000100s | 0 | 7 |
| 00100111s | 1 | 4 |
| 11111100s | 2 | 3 |
| 11111101s | 4 | 2 |
| 000000100s | 5 | 2 |
| 000000101s | 14 | 1 |
| 000000111s | 15 | 1 |
| 0000001101s | 16 | 1 |
| 1111011s | 0 | 8 |
| 1111100s | 0 | 9 |
| 00100011s | 0 | 10 |
| 00100010s | 0 | 11 |
| 00100000s | 1 | 5 |
| 0000001100s | 2 | 4 |
| 11111010s | 0 | 12 |
| 11111011s | 0 | 13 |
| 11111110s | 0 | 14 |
| 11111111s | 0 | 15 |

In Table 1, "s" stands for the sign of the level and takes a value of 0 when positive and 1 when negative. "EOB" represents a 4 bit end-of-block. The remaining entries of the variable word-length code table are the same as that of the known MPEG-1 variable word-length code table (not shown).

I claim:

1. An apparatus for performing variable word-length coding comprising:

a means for receiving video signals each having a run-length and a level, the video signals representing at least a portion of an intra-coded picture;

a means for performing variable word-length coding of the video signals in accordance with the following table:

| RUN LENGTH | LEVEL | | | | | | | |
|---|---|---|---|---|---|---|---|---|
| | 1 | 2 | 3 | 4 | 5 | 6 | 7 | 8 |
| 0 | 3 | 4 | 5 | 6 | 7 | 7 | 8 | 9 |
| 1 | 4 | 6 | 8 | 9 | 9 | | | |
| 2 | 6 | 8 | 9 | 11 | | | | |
| 3 | 6 | 9 | | | | | | |
| 4 | 7 | 9 | | | | | | |
| 5 | 7 | 10 | | | | | | |
| 6 | 8 | | | | | | | |
| 7 | 8 | | | | | | | |
| 8 | 8 | | | | | | | |
| 9 | 8 | | | | | | | |
| 10 | 8 | | | | | | | |
| 11 | 9 | | | | | | | |
| 12 | 9 | | | | | | | |
| 13 | 9 | | | | | | | |
| 14 | 10 | | | | | | | |
| 15 | 10 | | | | | | | |
| 16 | 11 | | | | | | | |

| RUN LENGTH | LEVEL | | | | | | |
|---|---|---|---|---|---|---|---|
| | 9 | 10 | 11 | 12 | 13 | 14 | 15 |
| 0 | 9 | 9 | 9 | 9 | 9 | 9 | 9 |
| 1 | | | | | | | |
| 2 | | | | | | | |
| 3 | | | | | | | |
| 4 | | | | | | | |
| 5 | | | | | | | |
| 6 | | | | | | | |
| 7 | | | | | | | |
| 8 | | | | | | | |
| 9 | | | | | | | |
| 10 | | | | | | | |
| 11 | | | | | | | |
| 12 | | | | | | | |
| 13 | | | | | | | |
| 14 | | | | | | | |
| 15 | | | | | | | |
| 16 | | | | | | | | in which the values on the abscissa each represent the level of a video signal, the values on the ordinate each represent the run-length of a video signal, and the entries in the table each represent a number of bits in codes to be assigned to a video signal.

2. The apparatus of claim 1 wherein said table includes a plurality of additional entries which are compatible with the Motion Pictures Expert Group Phase 1 standard.

3. The apparatus of claim 1 wherein a Motion Pictures Expert Group Phase 1 compatible variable word-length code is utilized to encode non-intra coded video signals.

4. The apparatus of claim 3 further including a means for adaptively selecting a first or a second coding mode.

5. The apparatus of claim 4 wherein said first coding mode utilizes variable word-length coding entries in said table.

6. The apparatus of claim 5 wherein said second coding mode utilizes Motion Pictures Expert Group Phase 1 compatible variable word-length coding.

7. The apparatus of claim 4 wherein said means for adaptively selecting are responsive to a picture type received by said means for receiving.

8. The apparatus of claim 1 wherein said variable word-length coding is performed on a segment of the received video signal wherein said segment is selected from the group consisting of blocks, macroblocks, and pictures.

9. The apparatus of claim 3 wherein said non-intra coded video signals includes inter-coded video signals.

10. The apparatus of claim 1 wherein said non-intra coded video signal includes predicted-coded video signals.

11. The apparatus of claim 1 wherein one or more MPEG-1 variable word-length codes are utilized when a received video signal has a combination of run-length and level for which there is no entry in said table.

12. A method for performing variable word-length coding comprising:

receiving video signals each having a run-length and a level, the video signals representing at least a portion of an intra-coded picture;

performing variable word-length coding of the video signals in accordance with the following table:

| RUN LENGTH | \multicolumn{8}{c}{LEVEL} |
|---|---|---|---|---|---|---|---|---|

| RUN LENGTH | 1 | 2 | 3 | 4 | 5 | 6 | 7 | 8 |
|---|---|---|---|---|---|---|---|---|
| 0 | 3 | 4 | 5 | 6 | 7 | 7 | 8 | 9 |
| 1 | 4 | 6 | 8 | 9 | 9 | | | |
| 2 | 6 | 8 | 9 | 11 | | | | |
| 3 | 6 | 9 | | | | | | |
| 4 | 7 | 9 | | | | | | |
| 5 | 7 | 10 | | | | | | |
| 6 | 8 | | | | | | | |
| 7 | 8 | | | | | | | |
| 8 | 8 | | | | | | | |
| 9 | 8 | | | | | | | |
| 10 | 8 | | | | | | | |
| 11 | 9 | | | | | | | |
| 12 | 9 | | | | | | | |
| 13 | 9 | | | | | | | |
| 14 | 10 | | | | | | | |
| 15 | 10 | | | | | | | |
| 16 | 11 | | | | | | | |

| RUN LENGTH | 9 | 10 | 11 | 12 | 13 | 14 | 15 |
|---|---|---|---|---|---|---|---|
| 0 | 9 | 9 | 9 | 9 | 9 | 9 | 9 |
| 1 | | | | | | | |
| 2 | | | | | | | |
| 3 | | | | | | | |
| 4 | | | | | | | |
| 5 | | | | | | | |
| 6 | | | | | | | |
| 7 | | | | | | | |
| 8 | | | | | | | |
| 9 | | | | | | | |
| 10 | | | | | | | |
| 11 | | | | | | | |
| 12 | | | | | | | |
| 13 | | | | | | | |
| 14 | | | | | | | |
| 15 | | | | | | | |
| 16 | | | | | | | | in which the values on the abscissa each represent the level of a video signal, the values on the ordinate each represent the run-length of a video signal, and the entries in the table each represent a number of bits in codes to be assigned to a video signal.

13. The method of claim 12 wherein one or more MPEG-1 variable word-length codes are utilized when a received video signal has a combination of run-length and level for which there is no entry in said table.

14. The method of claim 12 further including a step of adaptively selecting a first or a second coding mode.

15. The method of claim 12 wherein said first coding mode utilizes variable word length coding entries in said table.

16. The method of claim 15 wherein said second coding mode utilizes Motion Pictures Expert Group Phase 1 compatible variable word-length coding.

17. The method of claim 16 wherein said step of adaptively selecting is responsive to a picture type received during said step of receiving video signals.

18. The method of claim 12 wherein said variable word-length coding is performed on a segment of the received video signal wherein said segment is selected from the group consisting of blocks, macroblocks, and pictures.

* * * * *

UNITED STATES PATENT AND TRADEMARK OFFICE
CERTIFICATE OF CORRECTION

PATENT NO. : 5,563,593
DATED : October 8, 1996
INVENTOR(S) : Atul Puri

It is certified that error appears in the above-identified patent and that said Letters Patent is hereby corrected as shown below:

Column 10,
Line 5-40, delete the table in its entirety and substitute the following table

| RUN LENGTH | LEVEL | | | | | | | |
|---|---|---|---|---|---|---|---|---|
| | 1 | 2 | 3 | 4 | 5 | 6 | 7 | 8 |
| 0 | 3 | 4 | 5 | 6 | 6 | 7 | 7 | 8 |
| 1 | 4 | 6 | 8 | 9 | 9 | | | |
| 2 | 6 | 8 | 9 | 11 | | | | |
| 3 | 6 | 9 | | | | | | |
| 4 | 7 | 9 | | | | | | |
| 5 | 7 | 10 | | | | | | |
| 6 | 8 | | | | | | | |
| 7 | 8 | | | | | | | |
| 8 | 8 | | | | | | | |
| 9 | 8 | | | | | | | |
| 10 | 8 | | | | | | | |
| 11 | 9 | | | | | | | |
| 12 | 9 | | | | | | | |
| 13 | 9 | | | | | | | |
| 14 | 10 | | | | | | | |
| 15 | 10 | | | | | | | |
| 16 | 11 | | | | | | | |

| RUN LENGTH | LEVEL | | | | | | |
|---|---|---|---|---|---|---|---|
| | 9 | 10 | 11 | 12 | 13 | 14 | 15 |
| 0 | 8 | 9 | 9 | 9 | 9 | 9 | 9 |
| 1 | | | | | | | |
| 2 | | | | | | | |
| 3 | | | | | | | |
| 4 | | | | | | | |
| 5 | | | | | | | |
| 6 | | | | | | | |
| 7 | | | | | | | |
| 8 | | | | | | | |
| 9 | | | | | | | |
| 10 | | | | | | | |
| 11 | | | | | | | |
| 12 | | | | | | | |
| 13 | | | | | | | |
| 14 | | | | | | | |
| 15 | | | | | | | |
| 16 | | | | | | | |

UNITED STATES PATENT AND TRADEMARK OFFICE
CERTIFICATE OF CORRECTION

PATENT NO.   : 5,563,593
DATED        : October 8, 1996
INVENTOR(S)  : Atul Puri It is certified that error appears in the above-identified patent and that said Letters Patent is hereby corrected as shown below:

<u>Column 11, line 15 through Column 12, line 14,</u>
Delete the table in its entirety and substitute the following table

| RUN LENGTH | LEVEL | | | | | | | |
|---|---|---|---|---|---|---|---|---|
| | 1 | 2 | 3 | 4 | 5 | 6 | 7 | 8 |
| 0 | 3 | 4 | 5 | 6 | 6 | 7 | 7 | 8 |
| 1 | 4 | 6 | 8 | 9 | 9 | | | |
| 2 | 6 | 8 | 9 | 11 | | | | |
| 3 | 6 | 9 | | | | | | |
| 4 | 7 | 9 | | | | | | |
| 5 | 7 | 10 | | | | | | |
| 6 | 8 | | | | | | | |
| 7 | 8 | | | | | | | |
| 8 | 8 | | | | | | | |
| 9 | 8 | | | | | | | |
| 10 | 8 | | | | | | | |
| 11 | 9 | | | | | | | |
| 12 | 9 | | | | | | | |
| 13 | 9 | | | | | | | |
| 14 | 10 | | | | | | | |
| 15 | 10 | | | | | | | |
| 16 | 11 | | | | | | | |

UNITED STATES PATENT AND TRADEMARK OFFICE
CERTIFICATE OF CORRECTION

PATENT NO. : 5,563,593
DATED : October 8, 1996
INVENTOR(S) : Atul Puri

It is certified that error appears in the above-identified patent and that said Letters Patent is hereby corrected as shown below:

<u>Column 11, line 15 through Column 12, line 14 (cont'd),</u>

| RUN LENGTH | LEVEL | | | | | | |
|---|---|---|---|---|---|---|---|
| | 9 | 10 | 11 | 12 | 13 | 14 | 15 |
| 0 | 8 | 9 | 9 | 9 | 9 | 9 | 9 |
| 1 | | | | | | | |
| 2 | | | | | | | |
| 3 | | | | | | | |
| 4 | | | | | | | |
| 5 | | | | | | | |
| 6 | | | | | | | |
| 7 | | | | | | | |
| 8 | | | | | | | |
| 9 | | | | | | | |
| 10 | | | | | | | |
| 11 | | | | | | | |
| 12 | | | | | | | |
| 13 | | | | | | | |
| 14 | | | | | | | |
| 15 | | | | | | | |
| 16 | | | | | | | |

Signed and Sealed this

Twenty-eighth Day of March, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 5,563,593 |
| APPLICATION NO. | : 08/215341 |
| DATED | : October 8, 1996 |
| INVENTOR(S) | : Atul Puri |

It is certified that error appears in the above-identified patent and that said Letters Patent is hereby corrected as shown below:

Column 12, line 26, "claim 12" should read --claim 14--
Column 12, line 29, "claim 15" should read --claim 14--

Signed and Sealed this

Twenty-ninth Day of July, 2008

JON W. DUDAS
*Director of the United States Patent and Trademark Office*